(12) United States Patent
Sasaki (10) Patent No.: US 7,462,838 B2
(45) Date of Patent: Dec. 9, 2008

(54) ELECTROSTATIC DEFLECTION CONTROL CIRCUIT AND METHOD OF ELECTRONIC BEAM MEASURING APPARATUS

(75) Inventor: Hiroshi Sasaki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 270 days.

(21) Appl. No.: 11/521,465

(22) Filed: Sep. 15, 2006

(65) Prior Publication Data

US 2007/0063146 A1     Mar. 22, 2007

(30) Foreign Application Priority Data

Sep. 16, 2005     (JP)     ............................. 2005-270660

(51) Int. Cl.
 *H01J 3/26* (2006.01)
(52) U.S. Cl. ............ 250/396 R; 250/397; 250/396 ML; 250/310; 250/311; 315/370; 315/371; 315/364; 315/391; 315/395; 315/403
(58) Field of Classification Search ............ 250/396 R, 250/397, 396 ML, 310, 311; 315/370, 371, 315/364, 391, 395, 403
See application file for complete search history.

(56) References Cited

U.S. PATENT DOCUMENTS 3,911,321 A * 10/1975 Wardly ........................ 315/364
5,546,319 A *  8/1996 Satoh et al. .................... 716/21

FOREIGN PATENT DOCUMENTS

JP      10-199460 A    7/1998
JP     2002-117796 A   4/2002

* cited by examiner

*Primary Examiner*—Jack I. Berman
*Assistant Examiner*—Michael Maskell
(74) *Attorney, Agent, or Firm*—McDermott Will & Emery LLP (57) ABSTRACT

An electrostatic deflection circuit and method of an electronic beam measuring apparatus which can achieve the high precision of the electronic beam measuring and contribute to the simplification of the structure of the apparatus is provided. In an analog arithmetic circuit included in an analog operation part constituting an electrostatic deflection circuit, output voltages of multipliers are added and output by an adder. When the magnification is low, as the side of an ordinarily closed contact is closed driven by a relay driving circuit, the output of the adder is amplified by a high gain amplifier with a high amplification factor and applied to an electrostatic deflecting board. When the magnification is high, the side of an ordinarily open contact is closed and it is amplified by a low gain amplifier with a low amplification factor and applied to the electrostatic deflecting board in the same way.

4 Claims, 7 Drawing Sheets

ELECTROSTATIC DEFLECTION CONTROL CIRCUIT AND METHOD OF ELECTRONIC BEAM MEASURING APPARATUS

INCORPORATION BY REFERENCE

The present application claims priority from Japanese application JP2005-270660 filed on Sep. 16, 2005, the content of which is hereby incorporated by reference into this application.

BACKGROUND OF THE INVENTION

The present invention relates to an electrostatic deflection circuit and method for controlling the deflection of an electronic beam in an electronic beam measuring apparatus which scans a sample by an electron beam (electronic beam) and measures minute patterns.

The electronic beam measuring apparatus such as a scanning electron microscope generates an electronic beam from an electron gun and converges it on a sample, and at the same time applies a force on this electronic beam using a deflector, scans on the sample by deflecting irradiation points and collects information of the sample, and it is used, for example, for the check of the minute circuit patterns, etc.

The electronic beam measuring apparatus is generally requested to satisfy the conditions such as to be able to obtain an image of high precision with high resolution and minimum aberration such as noise and distortion, to be able to obtain a desired magnification, to have a wide field of vision, and that the apparatus is small and its structure is simple. In the electronic beam measuring apparatus, as described above, the deflector plays an important role with regard to the deflection of the electronic beam and the scan and there are the types of electromagnetic deflector and electrostatic deflector, but as these have different characteristics they have been used separately according to the use object or the use mode. For example, the electrostatic deflector, compared with the electromagnetic deflector, has characteristics such as to be able to obtain a large amount of deflection with small size and to be able to have a high speed scan rate because a high speed deflection is possible.

Thus, conventionally a focused ion beam device (the first conventional apparatus) has been proposed in which the electrostatic deflector and the electromagnetic deflector are arranged shifted in the direction of the light axis, and which performs the scan by the ion beam by the electromagnetic deflector with high magnification and performs the scan by the ion beam by the electrostatic deflector with low magnification (for example, refer to JP-A-10-199460, paragraphs 0018-0022, FIG. 2).

Also, a focused ion beam device (the second conventional apparatus) has been proposed which is provided with an electrostatic deflector in which each deflecting factor of the deflector is divided into two parts of the upstream side and the downstream side of the ion beam, and which switches the state in which both of the deflector of the upstream side and the deflector of the downstream side are connected to the deflecting power supply and the state in which only the deflector of the downstream side is connected to the deflecting power supply (for example, refer to JP-A-2002-117796, paragraph 0025, FIG. 6).

SUMMARY OF THE INVENTION

However, in the case of the first conventional apparatus described above, it is provided with both of the electrostatic deflector and the electromagnetic deflector and the electromagnetic deflector includes a coil and it generates the electromagnetic induction. Therefore, in this apparatus even while the deflection is being performed by the electrostatic deflector the beam passes through within the electromagnetic deflector and it is affected by the electromagnetic induction. For this reason, there has been a problem that it is difficult to obtain an image of high precision or high magnification because the center of the field of vision is shifted with the change of the scan magnification or the aberration such as a distortion is generated on the beam. Also, as it is provided with two kinds of deflectors there have been problems that it is difficult to mechanically match the light axes of the deflectors each other, moreover, that the structure of the entire deflector would be complicated, large, and expensive.

Also, in the second conventional apparatus described above, as the deflector is divided into 2 parts in the direction of the light axis, it is as the same structure as which is provided with substantially two sets of electrostatic deflectors. In this structure when the magnification is high only the deflector of the downstream side is used and the deflector of the upstream side is not used. For this reason, compared with an apparatus provided with a single deflector, there have been problems that the structure of the deflector itself would be complicated, at the same time the structure of the deflecting power supply would be double and the apparatus would be complicated, large, and expensive. Further, in this apparatus, there has been a problem that the control of the beam would be difficult and it is difficult to obtain an image of high precision and high magnification because the path length of the beam would be long, at the same time the beam possibly would be affected unexpectedly by the electrostatic deflector of the upstream side (the side to which the voltage is not applied).

Thus, the present invention, in consideration of the problems described above, is aimed to provide an electrostatic deflection circuit and method of an electronic beam measuring apparatus which can achieve the high precision of the electronic beam measuring and at the same time contribute to the simplification of the structure of the apparatus.

The electrostatic deflection circuit of the electronic beam measuring apparatus according to the present invention outputs a deflection signal to the electrostatic deflector to deflect the electronic beam to scan on the sample, includes a deflection circuit for low magnification comprising a first operational amplifier of a first amplification factor which amplifies the deflection signal by the first operational amplifier, a deflection circuit for high magnification comprising a second operational amplifier of a second amplification factor which is lower than the first amplification factor which amplifies the deflection signal by the second operational amplifier, and a switch circuit which switches to the deflection circuit for low magnification and outputs the deflection signal to the electrostatic deflector when a scan magnification of the electronic beam measuring apparatus is no more than a given value, and switches to the deflection circuit for high magnification and outputs the deflection signal to the electrostatic deflector when the scan magnification is over the given value.

Also, the electrostatic deflection method of the electronic beam measuring apparatus according to the present invention outputs a deflection signal to the electrostatic deflector to deflect the electronic beam to scan on the sample, includes a deflection process for low magnification with a first operational amplifier of a first amplification factor amplifying the deflection signal by the first operational amplifier, a deflection process for high magnification with a second operational amplifier of a second amplification factor which is lower than the first amplification factor amplifying the deflection signal by the second operational amplifier, and a switching process which switches to the deflection process for low magnification and outputs the deflection signal to the electrostatic deflector when a scan magnification of the electronic beam measuring apparatus is no more than a given value, and switches to the deflection process for high magnification and outputs the deflection signal to the electrostatic deflector when the scan magnification is over the given value.

According to the electrostatic deflection circuit and method of the electronic beam measuring apparatus of the present invention, it is possible to achieve the high precision of the electronic beam measuring and to contribute to the simplification of the structure of the apparatus because the deflection circuit for low magnification and the deflection circuit for high magnification are to be switched corresponding to the scan magnification.

Other objects, features and advantages of the invention will become apparent from the following description of the embodiments of the invention taken in conjunction with the accompanying drawings.

DESCRIPTION OF THE EMBODIMENTS

Next, an embodiment of the present invention will be explained in detail referring to the drawings.

Figure 1:
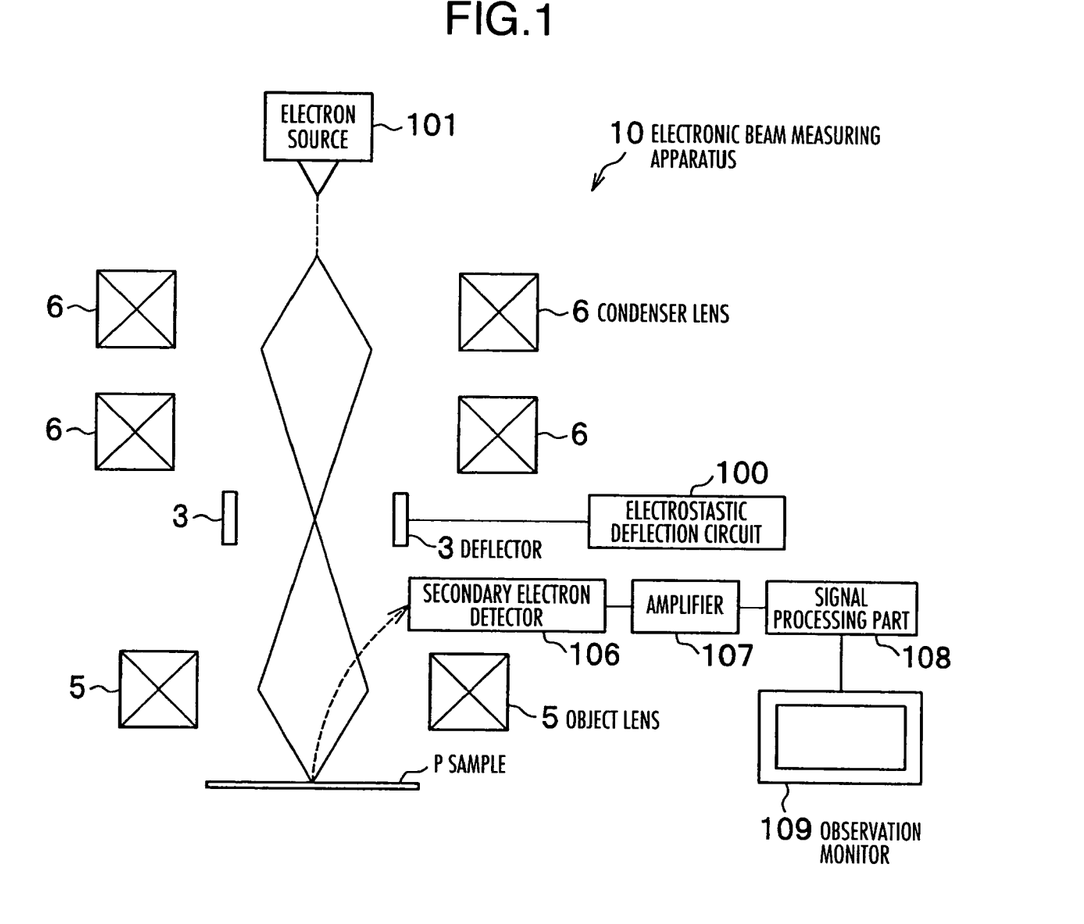
FIG. 1 is a principle structure diagram of an electronic beam measuring apparatus according to an embodiment of the present invention.

FIG. 1 is a principle structure diagram of an electronic beam measuring apparatus 10 according to an embodiment of the present invention.

The electronic beam measuring apparatus 10 is typically a scanning electron microscope (SEM) or such an apparatus provided with an additional function.

More specifically, the electronic beam measuring apparatus 10 is provided with an electron source 101 which generates an electron beam (electronic beam), a condenser lens 6 which once converges the electronic beam generated at the electron source 101, a deflector 3 which deflects the electronic beam by generating an electrostatic field, an electrostatic deflection circuit (corresponding to an "electrostatic deflection circuit" stated in the claims) 100 which supplies a deflection voltage to the deflector 3, an object lens 5 which focuses the electronic beam on a sample P by the object lens 5, a secondary electron detector 106 which detects a secondary electron radiated resulting from the electronic beam being irradiated on the sample P, an amplifier 107 which amplifies a detection signal which is output when the secondary electron detector 106 detects the secondary electron, a signal processing part 108 which generates an image data (or an image signal) of the sample P based on the amplified detection signal, and an observation monitor 109 which displays an image of the sample P based on the generated image data (or image signal).

Figure 2:
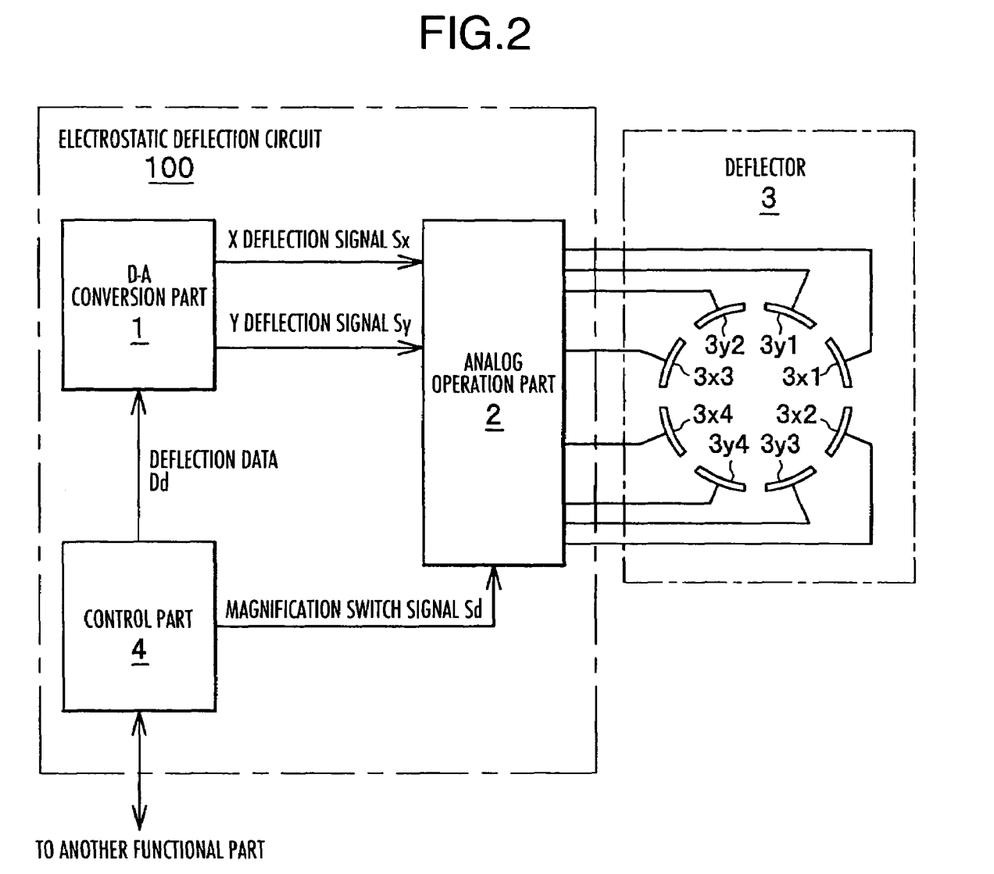
FIG. 2 is a block diagram showing a functional structure of an electrostatic deflection circuit and a deflector provided in the electronic beam measuring apparatus according to the embodiment of the present invention.

FIG. 2 is a block diagram showing a functional structure of the electrostatic deflection circuit 100 and the deflector 3 provided in the electronic beam measuring apparatus 10.

The electrostatic deflection circuit 100 and the deflector 3 also can be used for another charged particle beam such as a focused ion beam (FIB), etc. instead of being used for the electron beam (electronic beam). Also, it may be applied to a processing apparatus, etc. other than the measuring apparatus such as the electronic beam measuring apparatus 10.

The electrostatic deflection circuit 100 is for controlling the deflection direction and the deflection amount of the electronic beam (electron probe) which is radiated from an electronic beam generator (not shown) and has a desired current value converged by an electron lens (not shown) to scan a given area of the surface of the sample with a given pitch.

The electrostatic deflection circuit 100 is provided with a control part 4 which outputs deflection data Dd representing information of the scanning pattern of the electron probe as well as outputs a magnification switch signal Sd showing a low magnification or a high magnification corresponding to the setting of the electronic beam measuring apparatus, a D-A (Digital to Analog) conversion part 1 which converts the deflection data Dd from digital to analog and outputs it as a X deflection signal Sx and a Y deflection signal Sy, and an analog operation part 2 which applies a deflection voltage to each of electrostatic deflecting boards (described later) of the deflector 3 based on the magnification switch signal Sd, the X deflection signal Sx, and the Y deflection signal Sy.

Figure 3:
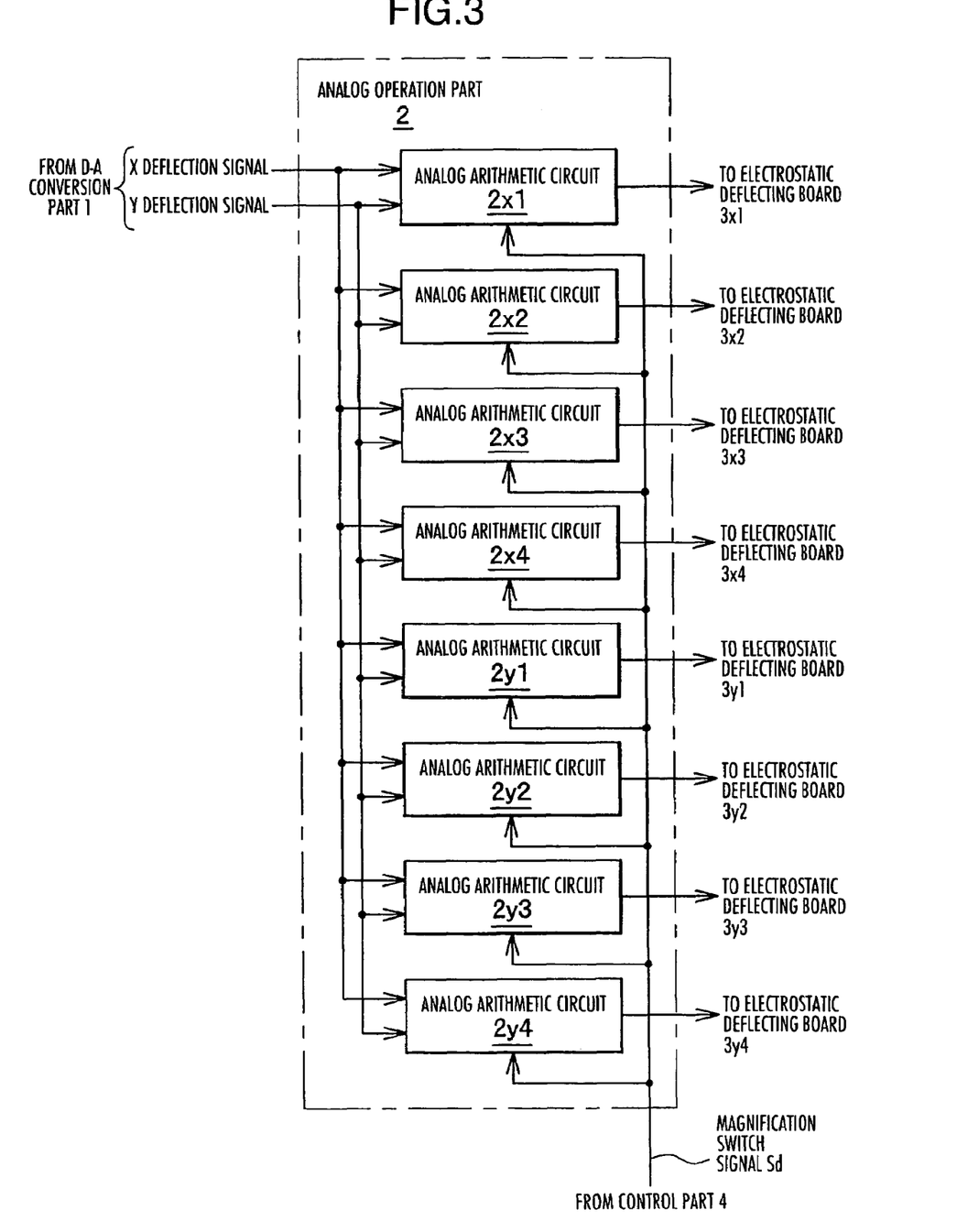
FIG. 3 is a block diagram showing an analog operation part according to the embodiment of the present invention in detail.

FIG. 3 is a block diagram showing the analog operation part 2 in detail.

The analog operation part 2 is provided with analog arithmetic circuits $2x1$-$2x4$, $2y1$-$2y4$. To the analog arithmetic circuits $2x1$-$2x4$, $2y1$-$2y4$ the magnification switch signal Sd is input from the control part 4 as well as the X deflection signal Sx and the Y deflection signal Sy are input from the D-A conversion part 1. Also, the deflection voltages X1-X4, Y1-Y4 output from the analog arithmetic circuits $2x1$-$2x4$, $2y1$-$2y4$ are applied to the electrostatic deflecting boards $3x1$-$3x4$, $3y1$-$3y4$ (described later) of the deflector 3 respectively.

Figure 4:
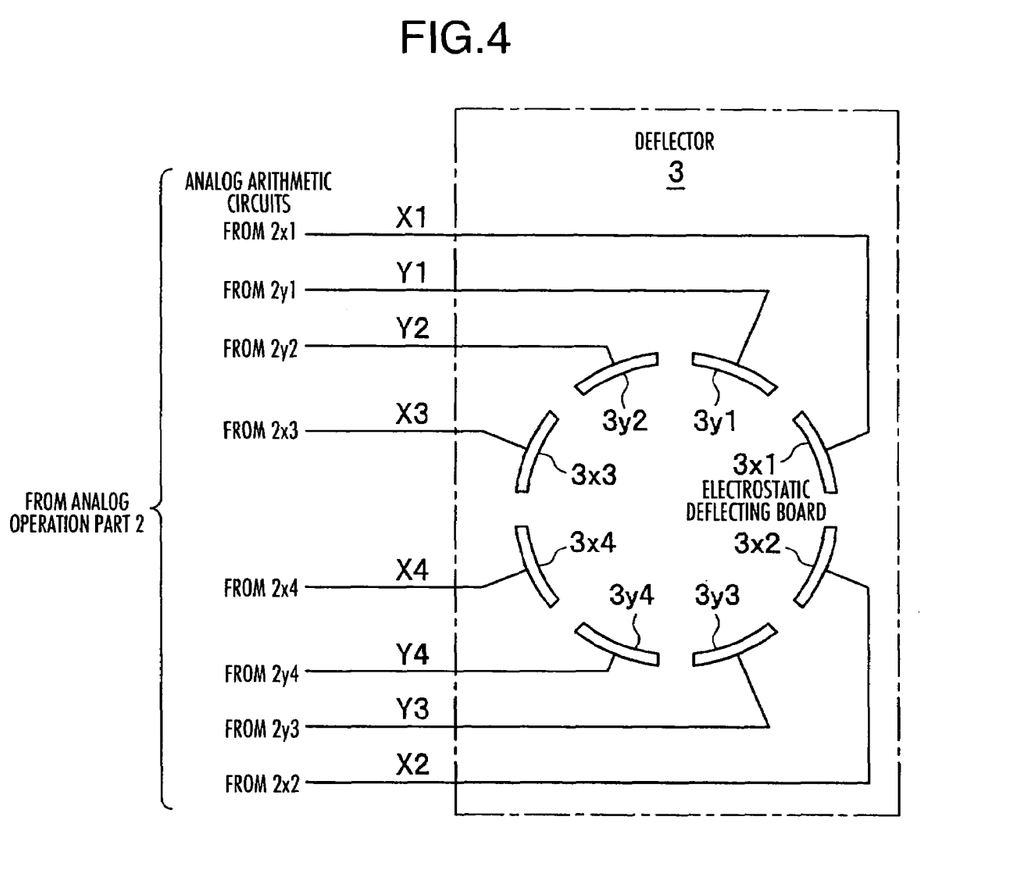
FIG. 4 is a description diagram showing the deflector according to the embodiment of the present invention in detail.

FIG. 4 is an explanatory diagram showing the deflector 3 in detail.

The deflector 3 comprises a plurality of electrostatic deflecting boards $3x1$-$3x4$, $3y1$-$3y4$ which work as deflecting factors for the electronic beam, and these are arranged in a ring around the light axis (a central axis along the forward direction of the electronic beam). Namely, as shown in FIG. 1, the electronic beam (electron probe) with the given current value passes within the ring of the deflector 3 and receives an influence of the electrostatic field in the ring and gets deflected at any of point on the path of being radiated out from the electron source 101, converged by the condenser lens 6, and focused on the sample P by the object lens 5.

Returning to FIG. 4, in this embodiment, for example from the point of view that the large amount of deflection can be obtained and the precision is good, as the deflector 3, an example using an 8 poles deflector which is provided with 8 electrostatic deflecting boards 3x1-3x4, 3y1-3y4 will be explained. Of course, the 8 poles deflector is an example and as the deflector 3 an electrostatic deflector which has another structure corresponding to the use object or mode, for example, a 4 poles deflector which is provided with 4 electrostatic deflecting boards X+, X−, Y+, and Y− (neither of them is shown) and has a simpler structure, etc. may be used.

Figure 5:
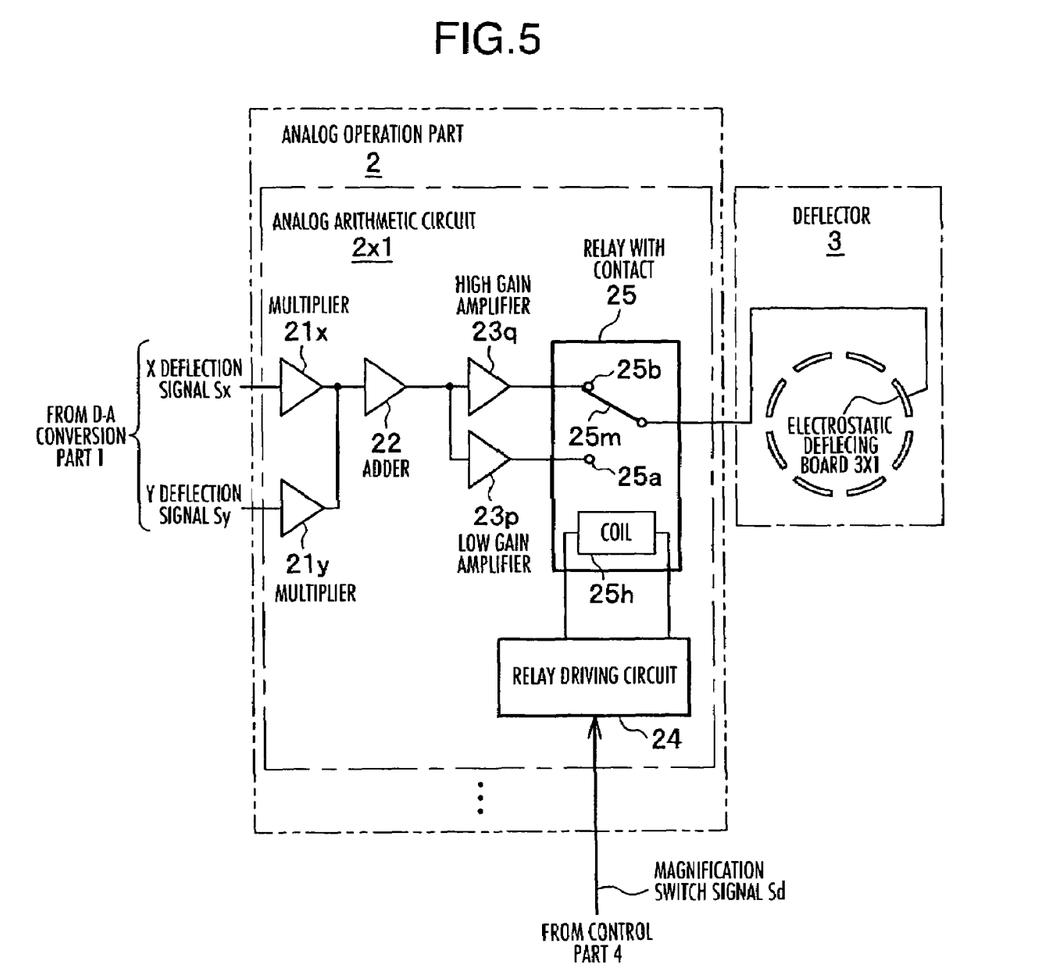
FIG. 5 is a block diagram showing an example of the structure of an analog arithmetic circuit included in the analog operation part according to the embodiment of the present invention in detail.

FIG. 5 is a block diagram showing an example of the structure of the analog arithmetic circuit 2x1 included in the analog operation part 2 in detail.

The structures of the analog arithmetic circuits 2x1-2x4, 2y1-2y4 are the same structures except that the multiplication rates of multipliers 21x and 21y (described later) are different.

The analog arithmetic circuit 2x1 is provided with a multiplier 21x which has the X deflection signal Sx input and multiplies its voltage (X deflection voltage Vx) by given times and output it, a multiplier 21y which has the Y deflection signal Sy input and multiplies its voltage (Y deflection voltage Vy) by given times and output it, an adder 22 which outputs a voltage which results from adding the output voltage of the multiplier 21x and the output voltage of the multiplier 21y, a high gain amplifier 23q and a low gain amplifier 23p which amplify the output voltage of the adder 22 by given gain and output it, a relay with contact 25 which switches either of the output of the high gain amplifier 23q or the output of the low gain amplifier 23p and output it to the electrostatic deflecting board 3x1, and a relay driving circuit 24 which drives the relay with contact 25.

The multipliers 21x, 21y are both operational amplifiers. The multipliers 21x, 21y of each of the analog arithmetic circuits 2x1-2x4, 2y1-2y4 amplify the voltage (the X deflection voltage Vx or the Y deflection voltage Vy) of the input signal (the X deflection signal Sx or the Y deflection signal Sy) by the following multiplication rate and output it. The multiplication rate $\alpha$, $\beta$ are set to add the main deflection signal and the deflection signal of its 90 degree direction to obtain a uniform electrostatic field in the deflector 3.

| sign of analog arithmetic circuit | multiplication rate of multiplier 21x | multiplication rate of multiplier 21y |
|---|---|---|
| 2x1 | +$\alpha$ | +$\beta$ |
| 2x2 | +$\alpha$ | −$\beta$ |
| 2x3 | −$\alpha$ | +$\beta$ |
| 2x4 | −$\alpha$ | −$\beta$ |
| 2y1 | +$\beta$ | +$\alpha$ |
| 2y2 | −$\beta$ | +$\alpha$ |
| 2y3 | +$\beta$ | −$\alpha$ |
| 2y4 | −$\beta$ | −$\alpha$ |

The adder 22 is structured including an operational amplifier. The output voltages of the adders 22 of each of the analog arithmetic circuits 2x1-2x4, 2y1-2y4 are as the followings.

| sign of analog arithmetic circuit | output voltage of adder 22 |
|---|---|
| 2x1 | +$\alpha$Vx +$\beta$Vy |
| 2x2 | +$\alpha$Vx −$\beta$Vy |
| 2x3 | −$\alpha$Vx +$\beta$Vy |
| 2x4 | −$\alpha$Vx −$\beta$Vy |
| 2y1 | +$\beta$Vx +$\alpha$Vy |
| 2y2 | −$\beta$Vx +$\alpha$Vy |
| 2y3 | +$\beta$Vx −$\alpha$Vy |
| 2y4 | −$\beta$Vx −$\alpha$Vy |

The low gain amplifier 23p is an operational amplifier including a differential amplifier circuit, a level shift circuit, an output circuit (either of them are not shown). The low gain amplifier 23p has a function to linearly amplify and output the input voltage from the adder 22, and when the input signal from the adder 22 is no input the output voltage is 0. The low gain amplifier 23p has a relatively small amplification factor, but as its noise figure (NF) is small (therefore the noise rate in the output signal is small), its linearity is good and its offset voltage is low, it can perform the highly precise amplification.

The high gain amplifier 23q is a similar circuit to the low gain amplifier 23p, but it is a so-called power operational amplifier and although the amplification factor and the output can be greater, the characteristics such as the noise figure, the linearity, and the lowness of the offset voltage are slightly worse than the low gain amplifier 23p.

The low gain amplifier 23p and the high gain amplifier 23q can be obtained at a low price and easily as a uniform one by using an appropriate kind from among the ones on the market as a packaged IC (Integrated Circuit) and by doing so a trouble of design or packaging can be saved. Of course the circuit may be implemented by combining the discrete devices.

Assuming that the amplification factor of the high gain amplifier 23q is A1, the output voltages of the high gain amplifiers 23q of each of the analog arithmetic circuits 2x1-2x4, 2y1-2y4 are the value which is the output voltage of the adder 22 multiplied by A1. Also, assuming that the amplification factor of the low gain amplifier 23p is A2, the output voltages of the low gain amplifiers 23p of each of the analog arithmetic circuits 2x1-2x4, 2y1-2y4 are the value which is the output voltage of the adder 22 multiplied by A2.

The relay with contact 25 is a relay of a 1a1b contact (c contact) mode relay which has mechanical contacts, and is provided with an ordinarily open contact (a contact) 25a connected to the low gain amplifier 23p, an ordinarily closed contact (b contact) 25b connected to the high gain amplifier 23q, a movable contact piece 25m consisting of a magnetic alloy and connected to the electrostatic deflecting board 3x1, and a coil 25h which generates a magnetic force when the operating current is supplied.

As the relay with contact 25 theoretically has no leakage current and its ON resistance is for example as small as a few tens m$\Omega$, it has an advantage that it can retain a good symmetry of the opposite electrostatic deflecting boards each other in the deflector 3.

As shown in FIG. 5, when the operating current is not supplied to the coil 25h, by the movable contact piece 25m returning to the ordinarily closed contact 25b side by a spring (not shown) or the elasticity of the movable contact piece 25m itself or a magnetic force of a magnet (not shown), between the ordinarily closed contact 25b and the movable contact piece 25m it is closed and at the same time the ordinarily open contact 25a is released. Also, when the operating current is supplied to the coil 25h, a magnetic force is generated to the coil 25h and by the movable contact piece 25m operating to the ordinarily open contact 25a side, between the ordinarily open contact 25a and the movable contact piece 25m it is closed and at the same time the ordinarily closed contact 25b is released.

From the point of view of avoiding the interference of the signal at the time of high magnification and the signal at the time of low magnification, the relay with contact 25 is preferably of the c contact mode, but a circuit which has a similar function may be implemented by combining a plurality of relays of 1a contact mode or 1b contact mode, or by using a part of multi-contact relay.

The relay driving circuit 24 drives the relay with contact 25 according to the magnification switch signal Sd input from the control part 4. That is, the relay driving circuit 24 does not supply the operating current to the coil 25h when the magnification switch signal Sd indicates the "low magnification". At this time, the output side of the high gain amplifier 23q is connected to the electrostatic deflecting board 3x1 and the output voltage (the deflection voltage X1) of the high gain amplifier 23q is applied to the electrostatic deflecting board 3x1. In the same way, the summary about the other analog arithmetic circuits 2x2-2x4, 2y1-2y4 is as the following. Here, the amplification factor of the high gain amplifier 23q is assumed to be A1.

| sign of analog arithmetic circuit | output voltage of analog arithmetic circuit | sign of electrostatic deflecting board of output destination |
|---|---|---|
| 2x1 | X1 = A1 (+αVx +βVy) | 3x1 |
| 2x2 | X2 = A1 (+αVx −βVy) | 3x2 |
| 2x3 | X3 = A1 (−αVx +βVy) | 3x3 |
| 2x4 | X4 = A1 (−αVx −βVy) | 3x4 |
| 2y1 | Y1 = A1 (+βVx +αVy) | 3y1 |
| 2y2 | Y2 = A1 (−βVx +αVy) | 3y2 |
| 2y3 | Y3 = A1 (+βVx −αVy) | 3y3 |
| 2y4 | Y4 = A1 (−βVx −αVy) | 3y4 |

Also, the relay driving circuit 24 supplies the operating current to the coil 25h when the magnification switch signal Sd indicates the "high magnification". At this time, the output side of the low gain amplifier 23p is connected to the electrostatic deflecting board 3x1 and the output voltage (the deflection voltage X1) of the low gain amplifier 23p is applied to the electrostatic deflecting board 3x1. In the same way, the summary about the other analog arithmetic circuits 2x2-2x4, 2y1-2y4 is as the following. Here, the amplification factor of the low gain amplifier 23p is assumed to be A2.

| sign of analog arithmetic circuit | output voltage of analog arithmetic circuit | sign of electrostatic deflecting board of output destination |
|---|---|---|
| 2x1 | X1 = A2 (+αVx +βVy) | 3x1 |
| 2x2 | X2 = A2 (+αVx −βVy) | 3x2 |
| 2x3 | X3 = A2 (−αVx +βVy) | 3x3 |
| 2x4 | X4 = A2 (−αVx −βVy) | 3x4 |
| 2y1 | Y1 = A2 (+βVx +αVy) | 3y1 |
| 2y2 | Y2 = A2 (−βVx +αVy) | 3y2 |
| 2y3 | Y3 = A2 (+βVx −αVy) | 3y3 |
| 2y4 | Y4 = A2 (−βVx −αVy) | 3y4 |

In this way, by inputting the necessary X deflection signal Sx and Y deflection signal Sy to the analog operation part 2, it is possible to create a desired electrostatic field within the ring of the deflector 3, and by changing the X deflection voltage Vx and the Y deflection voltage Vy by time, it is possible to change the deflection direction and the deflection amount of the electronic beam to scan on the sample. Further, by switching the magnification switch signal Sd to "low magnification" or "high magnification", the scan magnification can be switched to the low magnification or the high magnification.

The electronic beam measuring apparatus of this embodiment can be used with the scan magnification of low magnification and high magnification. As the deflection voltage when the scan magnification is low magnification is, for example, a few hundreds V at the most, the output circuit (not shown) of the high gain amplifier 23q needs to have a high pressure resistance to resist this voltage. Also, as the deflection voltage when the scan magnification is high magnification is, for example, a few V–a few hundreds mV at the most, the output circuit (not shown) of the low gain amplifier 23p only needs to have the pressure resistance for this pressure.

Also, in the case when the image obtained by the measuring is displayed for example using an image display device (not shown) of 512 pixel×512 pixel, as the deflection voltage per 1 pixel at the low magnification is a few hundreds mV/pixel–a few V/pixel, the deflection system for low magnification including the high gain amplifier 23q only needs to have the precision corresponding to this. Also, as the deflection voltage per 1 pixel at the high magnification is about a few mV/pixel, the deflection system for high magnification including the low gain amplifier 23p is supposed to have a high precision corresponding to this.

The so-called power operational amplifier device has the noise element at the used frequency of for example a few tens μV, namely about 1 percent of the deflection voltage per 1 pixel at the high magnification. Therefore, the power operational amplifier device can obtain a sufficient scan waveform precision as for the deflection voltage output when the magnification is low, but as for the deflection voltage output when the magnification is high it cannot obtain sufficient scan waveform precision.

Further, the deflection voltage per 1 pixel when the magnification is high is, for example, a few mV/pixel, and it is almost equal to the offset voltage of the power operational amplifier device (here, the offset voltage is also amplified by the gain of the power operational amplifier device). Therefore, it is generated the pixel shift (image shift) by this offset voltage from the intended beam irradiation location. In this way, when the offset voltage is large, it becomes difficult to irradiate accurately the electronic beam to the surface of the sample.

For example, if the design rule of the integrated circuit to be a sample is 200 nm, the pattern measuring would be performed with the magnification of 200 thousands times, and the deflection voltage per 1 pixel at that time would be about 3.4 mV/pixel. Also, if the design rule is 90 nm, the pattern measuring would be performed with the magnification of 400 thousands times, and the deflection voltage per 1 pixel at that time would be about ½ of that of when the magnification is 200 thousands times, namely about 1.7 mV/pixel. The value of the deflection voltage at this time is almost equal to the noise level or the offset voltage of the power operational amplifier device.

In this embodiment, the problems described above are solved by switching to the output from the high gain amplifier 23q which has a high pressure resistance and high output by the relay with contact 25 at the time of low magnification when it is necessary to output a high deflection voltage to the deflector 3, and by switching to the output from the low gain amplifier 23p with low noise and low offset voltage by the relay with contact 25 at the time of high magnification when it is necessary to output a high precision deflection voltage waveform to the deflector 3.

Therefore, when the magnification is low as the deflection signal is amplified by the high gain amplifier 23q the electronic beam measuring of wide field of view can be performed with sufficient precision, and when the magnification is high as the deflection signal is amplified by the low gain amplifier 23p the electronic beam measuring with small noise and aberration and with high precision can be performed.

On switching to the low magnification or to the high magnification, if it is configured to be performed with the magnification with which the deflection voltage per 1 pixel would be greater than the offset voltage of the high gain amplifier 23q, the image shift resulting from the switching of the low magnification and the high magnification is rarely generated. By this configuration, it is possible to omit the offset adjustment of the high gain amplifier 23q.

Also, by performing the switching by the relay with contact 25, as the structure of the analog arithmetic circuits 2x1-2x4, 2y1-2y4 except the high gain amplifier 23q and the low gain amplifier 23p can be used in common at the time of the low magnification and the high magnification, the deterioration of the precision by the device scattering can be restrained as well as the circuit can be simplified. Also, as the deflection of the electronic beam at the time of the low magnification and the high magnification can be performed by one deflector 3, the deflection mechanism of the electronic beam such as the deflector 3 can be simplified.

Figure 6:
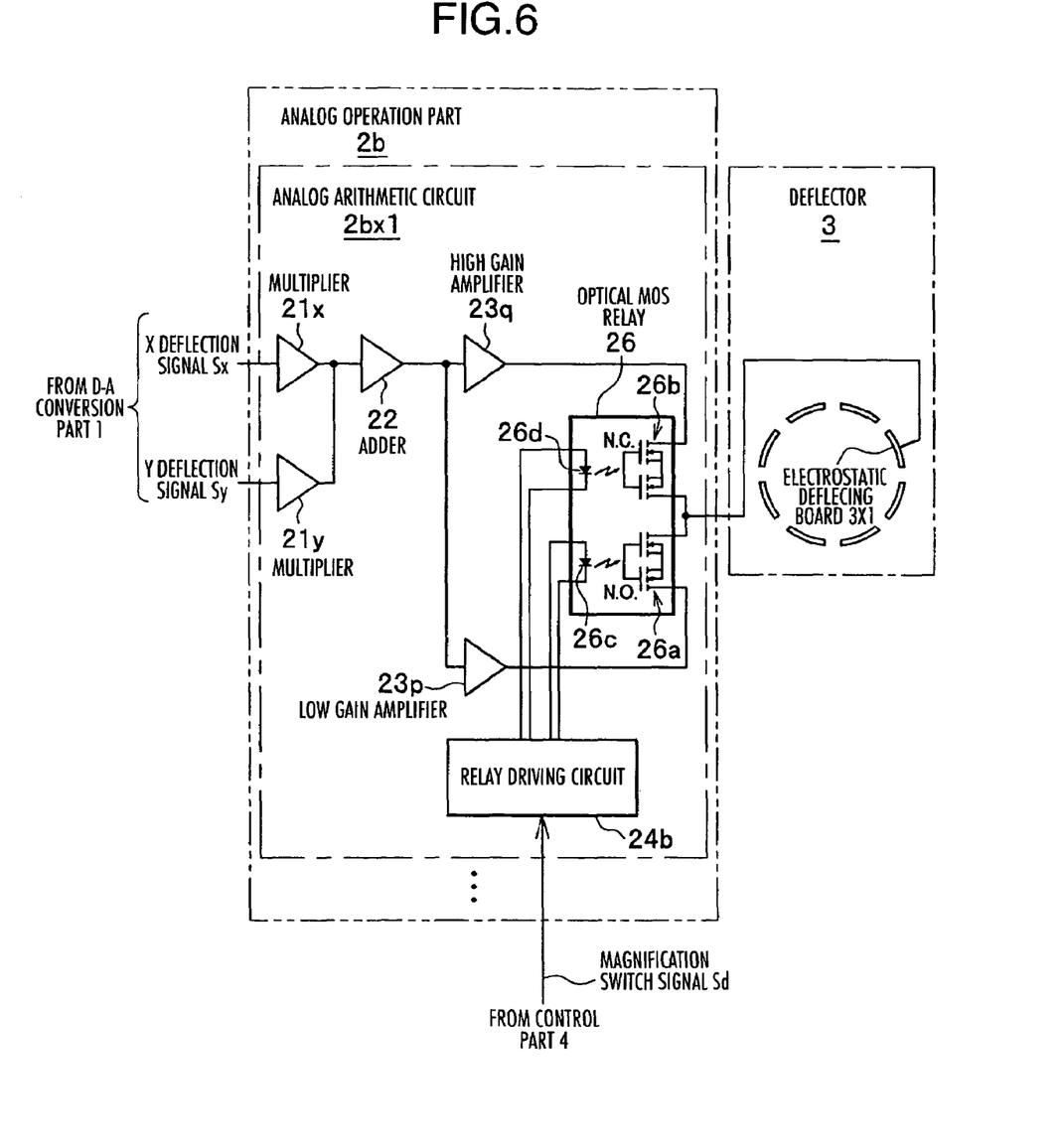
FIG. 6 is a block diagram showing the analog arithmetic circuit included in the analog operation part of a deformed example according to the embodiment of the present invention in detail.

FIG. 6 is a block diagram showing an analog arithmetic circuit 2bx1 included in an analog operation part 2b of a deformed example in detail.

The analog operation part 2b can be used instead of the analog operation part 2 and has the similar function. The analog operation part 2b is provided with, instead of the analog arithmetic circuits 2x1-2x4, 2y1-2y4 (see FIG. 3), analog arithmetic circuits 2bx1-2bx4, 2by1-2by4 which have the similar function.

The analog arithmetic circuit 2bx1 has the similar structure to the analog arithmetic circuit 2x1 except that it is provided with an optical MOS relay 26 instead of the relay with contact 25 and a relay driving circuit 24b instead of the relay driving circuit 24. Also, as the analog arithmetic circuits 2bx2-2bx4, 2by1-2by4 have the similar structure to the analog arithmetic circuit 2bx1, their illustration is omitted.

The optical MOS relay 26 is provided with an ordinarily open device 26a including a light receiving device and a power MOSFET, a light emitting device 26c on the side of the ordinarily open device 26a, an ordinarily closed device 26b including a light receiving device and a power MOSFET, and a light emitting device 26d on the side of the ordinarily closed device 26b.

The relay driving circuit 24b, when the magnification switch signal Sd indicates the "low magnification", puts the light emitting device 26c off and puts the ordinarily open device 26a in a non-conductive state, as well as lights the light emitting device 26d and puts the ordinarily closed device 26b in a conductive state. Thereby, the output voltage (the deflection voltage X1) of the high gain amplifier 23q is applied to the electrostatic deflecting board 3x1.

Also, the relay driving circuit 24b, when the magnification switch signal Sd indicates the "high magnification", lights the light emitting device 26c and puts the ordinarily open device 26a in a conductive state, as well as puts the light emitting device 26d off and puts the ordinarily closed device 26b in a non-conductive state. Thereby, the output voltage (the deflection voltage X1) of the low gain amplifier 23p is applied to the electrostatic deflecting board 3x1.

By using the optical MOS relay 26, it is possible to switch the low magnification and the high magnification at a high speed and it has an advantage that as it does not have the mechanical contact it has a longer life and the reliability of the contact is enhanced.

Instead of the optical MOS relay 26, a semiconductor relay without contact of another form may be used. Further, it is possible to use another device which has a switching function such as a hybrid relay or a switching device.

Figure 7:
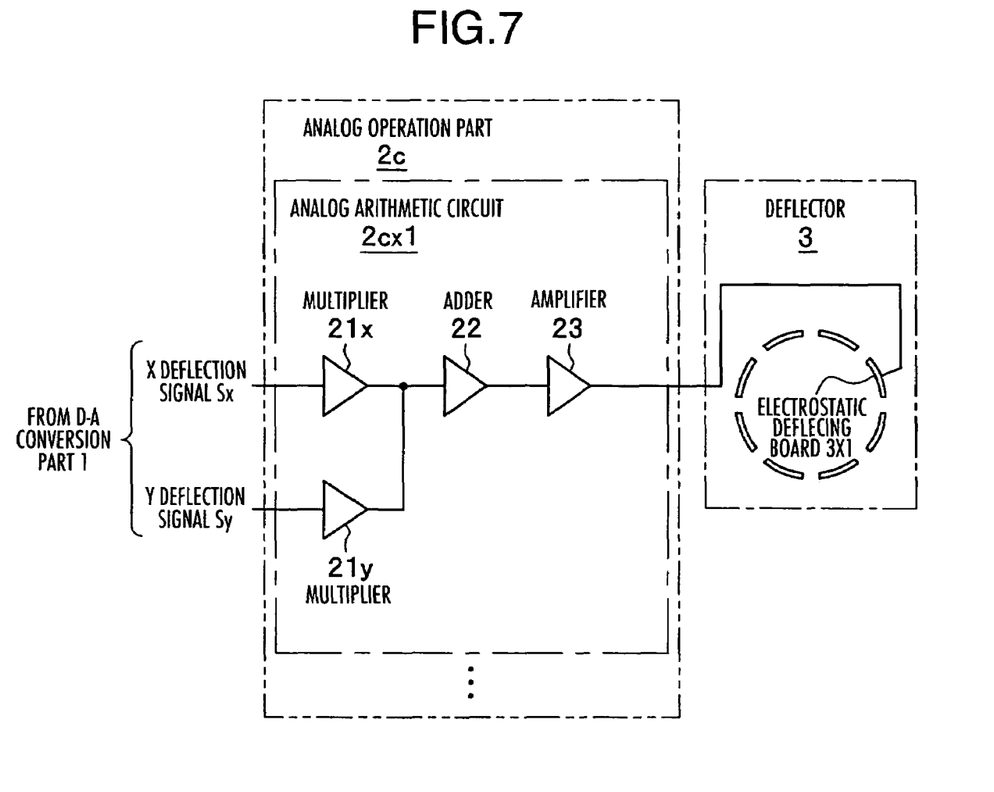
FIG. 7 is a block diagram showing the analog arithmetic circuit included in the analog operation part of another embodiment in detail.

FIG. 7 is a block diagram showing an analog arithmetic circuit 2cx1 included in an analog operation part 2c of another embodiment in detail.

In this analog arithmetic circuit 2cx1 it does not have the function of switching the low magnification and the high magnification and it amplifies the input voltage from the adder 22 by one amplifier 23 and applies it to the electrostatic deflecting board 3x1.

In the case when this electronic beam measuring apparatus is made to be usable with the low magnification, it is necessary to use an operational amplifier which has high output capacity and high pressure resistance capacity for the amplifier 23. For this reason, when it is used with the high magnification the noise or the offset voltage will be large and a high precision image may not be obtained.

Also, in the case when this electronic beam measuring apparatus is made to be suitable to the usage with the high magnification, it is necessary to use a high precision operational amplifier for the amplifier 23. For this reason, when the magnification is low, it may not be used because the pressure resistance and the high output may be insufficient.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electrostatic deflection circuit of an electronic beam measuring apparatus which outputs a deflection signal to an electrostatic deflector to deflect an electronic beam to scan on a sample, comprises:
    a deflection circuit for low magnification comprising a first operational amplifier of a first amplification factor which amplifies the deflection signal by the first operational amplifier;
    a deflection circuit for high magnification comprising a second operational amplifier of a second amplification factor which is lower than the first amplification factor, which amplifies the deflection signal by the second operational amplifier; and
    a switch circuit which switches to the deflection circuit for low magnification and outputs the deflection signal to the electrostatic deflector when a scan magnification of the electronic beam measuring apparatus is no more than a given value, and switches to the deflection circuit for high magnification and outputs the deflection signal to the electrostatic deflector when the scan magnification is over the given value.

2. The electrostatic deflection circuit of the electronic beam measuring apparatus according to claim 1, wherein
    the switch circuit performs the switching by a relay with contact.

3. The electrostatic deflection circuit of the electronic beam measuring apparatus according to claim 1, wherein
    the switch circuit performs the switching by a semiconductor relay.

4. An electrostatic deflection method of an electronic beam measuring apparatus which outputs a deflection signal to an electrostatic deflector to deflect an electronic beam to scan on a sample, comprises:
    a deflection process for low magnification with a first operational amplifier of a first amplification factor amplifying the deflection signal by the first operational amplifier;

a deflection process for high magnification with a second operational amplifier of a second amplification factor which is lower than the first amplification factor amplifying the deflection signal by the second operational amplifier; and a switching process which switches to the deflection process for low magnification and outputs the deflection signal to the electrostatic deflector when a scan magnification of the electronic beam measuring apparatus is no more than a given value, and switches to the deflection process for high magnification and outputs the deflection signal to the electrostatic deflector when the scan magnification is over the given value.

* * * * *